United States Patent
LaGrotta et al.

(10) Patent No.: US 6,374,912 B1
(45) Date of Patent: Apr. 23, 2002

(54) DEEP DRAWN ENCLOSURE WITH INTEGRATED HEATSINK AND FASTENING DETAILS

(75) Inventors: Richard T. LaGrotta, Livingston; Manuel G. Orellana, Long Valley, both of NJ (US)

(73) Assignee: Lucent Technologies, Murray Hill, NJ (US)

( * ) Notice: Subject to any disclaimer, the term of this patent is extended or adjusted under 35 U.S.C. 154(b) by 0 days.

(21) Appl. No.: 09/223,376

(22) Filed: Dec. 30, 1998

(51) Int. Cl.[7] .................................................. H05K 7/20
(52) U.S. Cl. ................ 165/185; 165/80.3; 165/104.33; 174/50; 174/52.3; 174/356 C; 174/50.5; 174/50.51; 174/17 CT; 361/688; 361/715
(58) Field of Search ....................... 165/104.33, 104.34, 165/80.3, 185; 174/50, 50.5, 50.51, 17 CT, 17 VA, 356 C; 361/715, 688

(56) References Cited

U.S. PATENT DOCUMENTS

| | | | | |
|---|---|---|---|---|
| 3,002,044 A | * | 9/1961 | Scoville ........................ | 174/50 |
| 3,075,487 A | * | 1/1963 | Appleton ..................... | 174/50 |
| 3,264,526 A | * | 8/1966 | Wiggerman ................. | 361/715 |
| 3,801,727 A | * | 4/1974 | Wilkinson et al. ............ | 174/50 |
| 3,885,701 A | * | 5/1975 | Becklin ...................... | 174/52.3 |
| 4,158,757 A | * | 6/1979 | Reichert et al. ........... | 174/52.3 |
| 4,997,034 A | * | 3/1991 | Steffen et al. ......... | 165/104.33 |
| 5,323,292 A | * | 6/1994 | Brzezinski ............. | 165/104.33 |
| 5,545,841 A | * | 8/1996 | Wilfinger et al. ............ | 174/50 |
| 5,621,615 A | * | 4/1997 | Dawson et al. ............. | 361/715 |
| 5,999,406 A | * | 12/1999 | McKain et al. ............. | 361/688 |
| 6,028,769 A | * | 2/2000 | Zurek ....................... | 174/50.51 |
| 6,038,129 A | * | 3/2000 | Falaki et al. ................. | 361/688 |

FOREIGN PATENT DOCUMENTS

| | | | | |
|---|---|---|---|---|
| DE | 1000469 | * | 1/1957 | ............ 174/35 GC |
| FR | 1126866 | * | 12/1956 | .................. 174/50 |
| GB | 588253 | * | 5/1947 | .................. 174/50 |
| JP | 4-259286 | * | 9/1992 | ............ 174/35 GC |

* cited by examiner

Primary Examiner—John K. Ford

(57) ABSTRACT

A weather resistant cabinet for housing electrical equipment includes a one-piece, unitary tubular housing. The tubular housing has two open ends and is preferably formed from aluminum using a deep-drawing process. Two covers are attached to the two open ends of the tubular housing. The two covers include heat sinks and are preferably formed from aluminum using an extruding process. The covers are attached to the tubular housing using either mechanical fasteners and a gasket, or by a dip-brazing process.

12 Claims, 6 Drawing Sheets

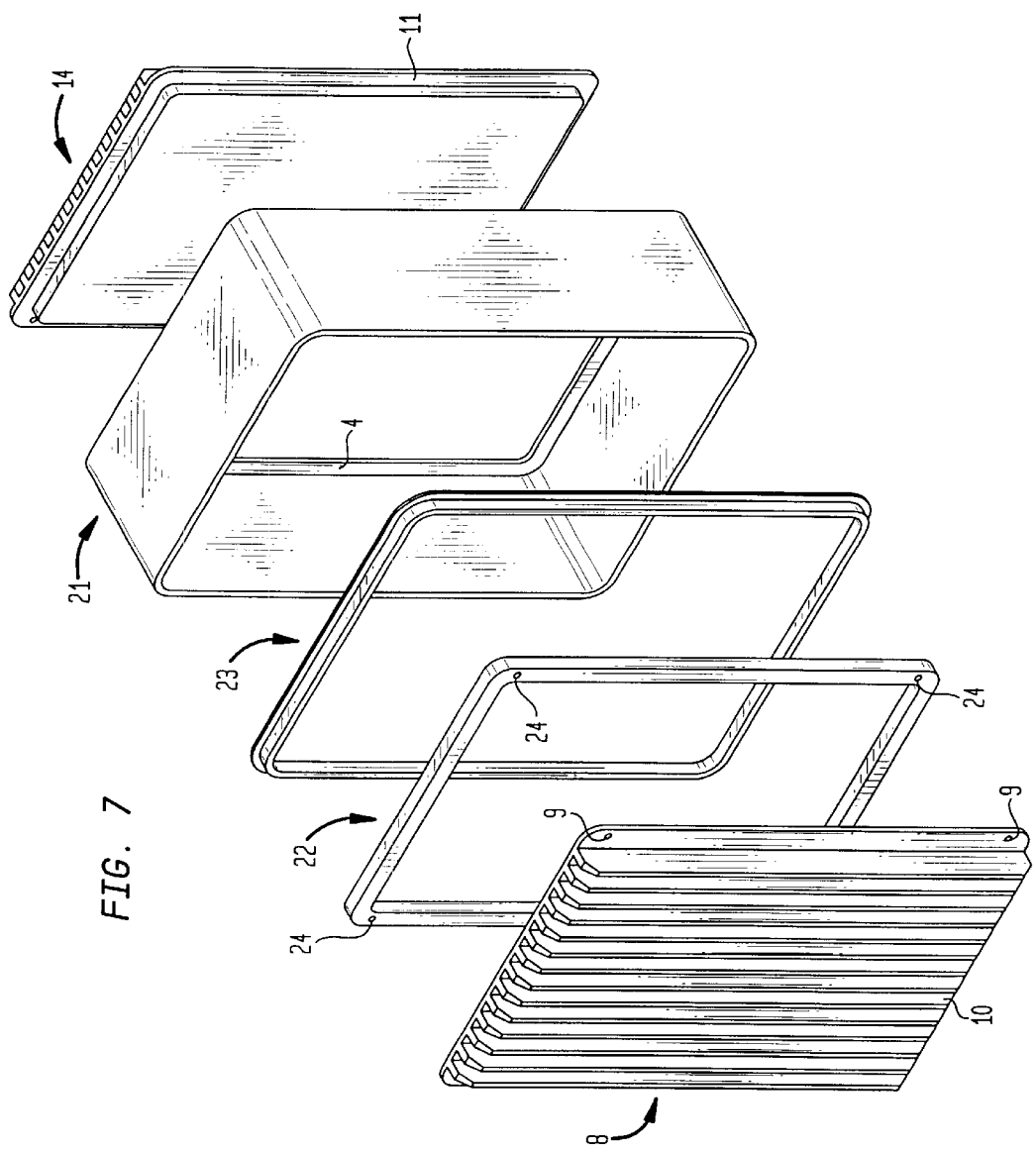

DEEP DRAWN ENCLOSURE WITH INTEGRATED HEATSINK AND FASTENING DETAILS

BACKGROUND OF THE INVENTION

1. Field of the Invention

The present invention relates to a weather resistant cabinet. More specifically, the present invention relates to a weather resistant cabinet for containing electrical equipment, which cabinet is easy to manufacture and assemble, and which cabinet provides convective heat dissipation for the electrical equipment contained within.

2. Description of the Background Art

Various weather resistant cabinets are known in the existing arts. For example, in the telecommunications field, electrical equipment located in the field, such as a junction terminal on a phone pole or a supplemental cellular base station on a bridge underpass, is contained within a weather resistant cabinet.

In the example of the supplemental cellular base station, one known weather resistant cabinet is the TDMA (Time Division Multiple Access) electronics enclosure. The TDMA enclosure includes six aluminum extrusions parts and miscellaneous sheet metal parts. The various parts are overlapped and joined to one another. In joining the parts, a special epoxy may be used, and/or a hole may be drilled through the overlapped portions and a simple pop rivet installed. Alternatively, a riv-nut may be installed in an inner hole and a threaded fastener passed through an outer hole to attach the overlapped inner and outer holes, and thereby the inner and outer overlapped portions.

The TDMA enclosure has several disadvantages. First, many components are required which bears on the manufacturing cost. Second, these many components must be assembled which bears on the assembly cost. Third, the interconnection between the component parts tends to leak moisture into the enclosure which leads to electrical malfunctions. These malfunctions necessitate service operations and replacement of electrical equipment.

The leaks occur because the rivets, over time, loosen. Further, because of the many component parts, each overlap is considered a leak risk due to manufacturing tolerances. Also, the thermal expansion rate of the various components will differ and, over time, the overlaps and rivets will deteriorate and develop leaks.

Accordingly, there exists a need in the art for a weather resistant cabinet having a limited number of component parts which are simple and inexpensive to manufacture, wherein the component parts may be easily assembled to form the cabinet, and wherein the interconnections between the component parts do not leak moisture or debris from the environment into the interior of the cabinet.

SUMMARY OF THE INVENTION

Accordingly, it is a primary object of the present invention to provide a weather resistant cabinet having component parts which are simple in design and relatively less expensive to manufacture.

Another object of the present invention is to provide a weather resistant cabinet having component parts which may be easily assembled to form the cabinet.

Yet another object of the present invention is to provide a weather resistant cabinet having component parts which do not leak moisture or debris from the environment into the interior of the cabinet.

These and other objects of the present invention are fulfilled by providing a cabinet for housing electrical equipment comprising: tubular housing and said first cover; and at least one fastener interconnecting said first cover and said tubular housing while compressing said first gasket wherein said first cover includes a frame having a third opening and a panel, in the form of a ribbed heatsink, attached to said frame by dip-brazing so as to close said third opening in said frame.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is an exploded view of a weather resistant cabinet having a modified tubular housing, in accordance with the present invention.

DETAILED DESCRIPTION OF THE PREFERRED EMBODIMENTS

Figure 1:
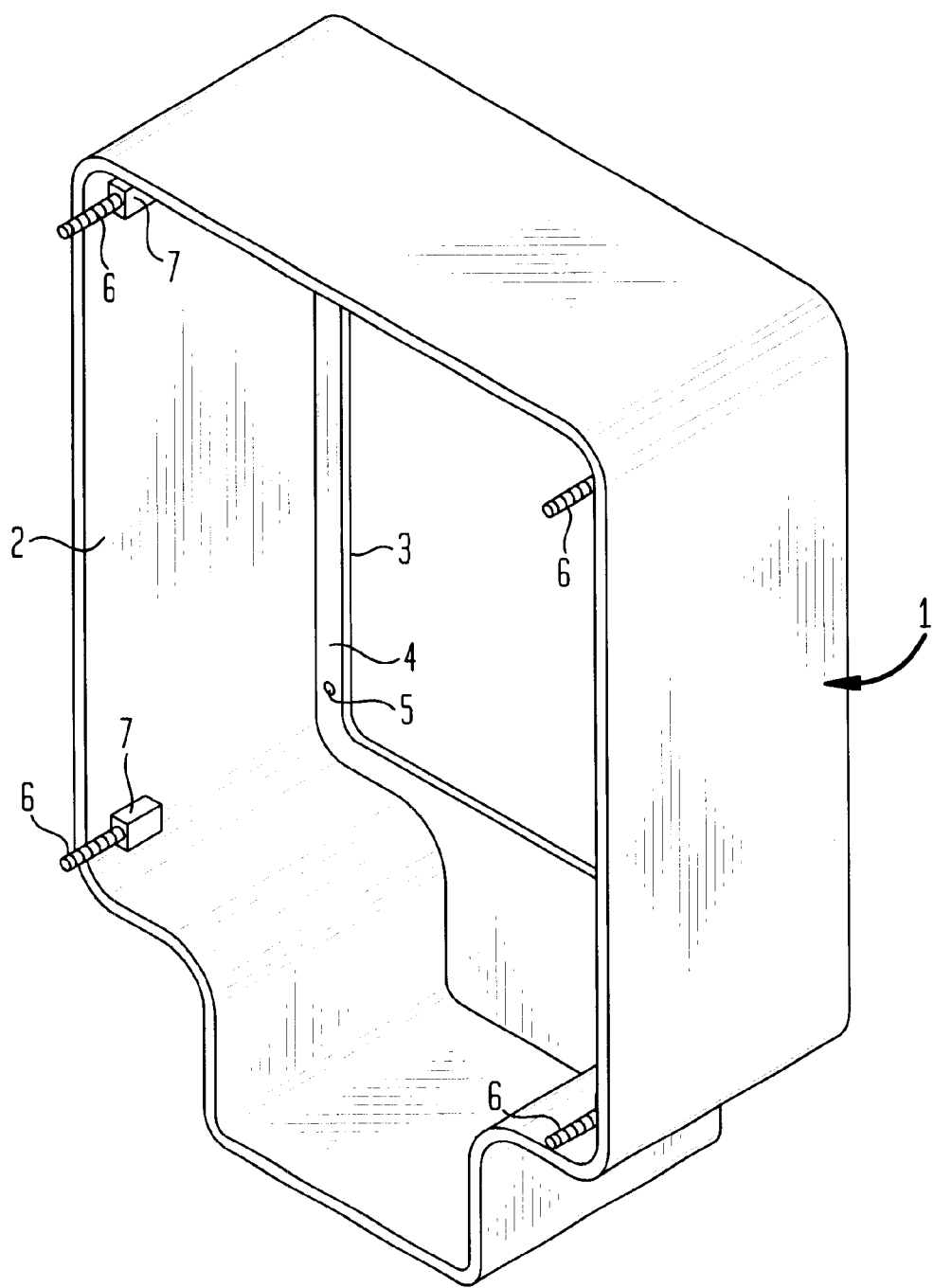
FIG. 1 is a perspective view of a tubular housing having two open ends.

Referring in detail to the drawings and with particular reference to FIG. 1, a tubular housing 1 in accordance with the present invention is illustrated. The tubular housing 1 is formed as a one-piece, unitary body. The tubular housing 1 has a first open end 2 and a second open end 3. The second open end 3 is rectangular and is defined by a lip 4. Four threaded through holes 5 are provided in the lip 4, adjacent to the corners of the rectangular second open end 3.

The tubular housing 1 also includes four threaded studs 6 mounted within blocks 7. The blocks 7 are attached to inner surfaces of the tubular housing 1. The studs 6 extend outwardly of the first open end 2.

To form the tubular housing 1, a sheet of aluminum is placed over a die and a deep-drawn process is used to shape the aluminum. Later, the threaded through holes 5 are formed in the lip 4 by a tap, and the blocks 7 are welded to the inner surfaces of the tubular housing 1. Deep-drawn manufacturing processes using aluminum have enjoyed wide spread usage and success in the automotive manufacturing and luggage manufacturing industries. Therefore, the particulars of the processes will not be described in detail herein. Of course, other known manufacturing techniques could be used to form the tubular housing 1.

Figure 2:
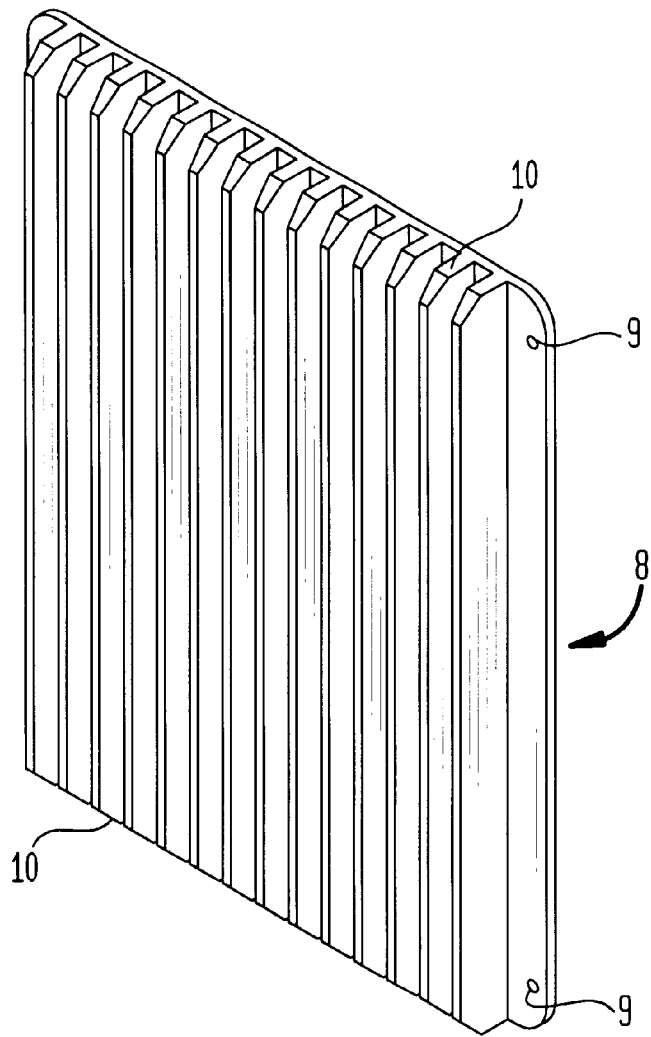
FIG. 2 is a perspective view of a cover having heat sinks.

FIG. 2 illustrates a first cover 8. The first cover 8 is generally shaped as a flat, rectangular plate. Four smooth through holes 9 are bored through the first cover 8 adjacent to the corners thereof. One face of the first cover 8 includes a plurality of heat sinks 10. The other face of the first cover 8 has a recessed shelf 11 formed along the perimeter edges (See FIGS. 3–5).

To form the first cover 8, aluminum is extruded through a mold. After extrusion, portions of the aluminum material may be removed or polished to shape the upper and lower features of the first cover 8, and the through holes 9 are drilled through the recessed shelf 11. Of course, other known manufacturing techniques could be used to form the first cover 8.

Figure 3:
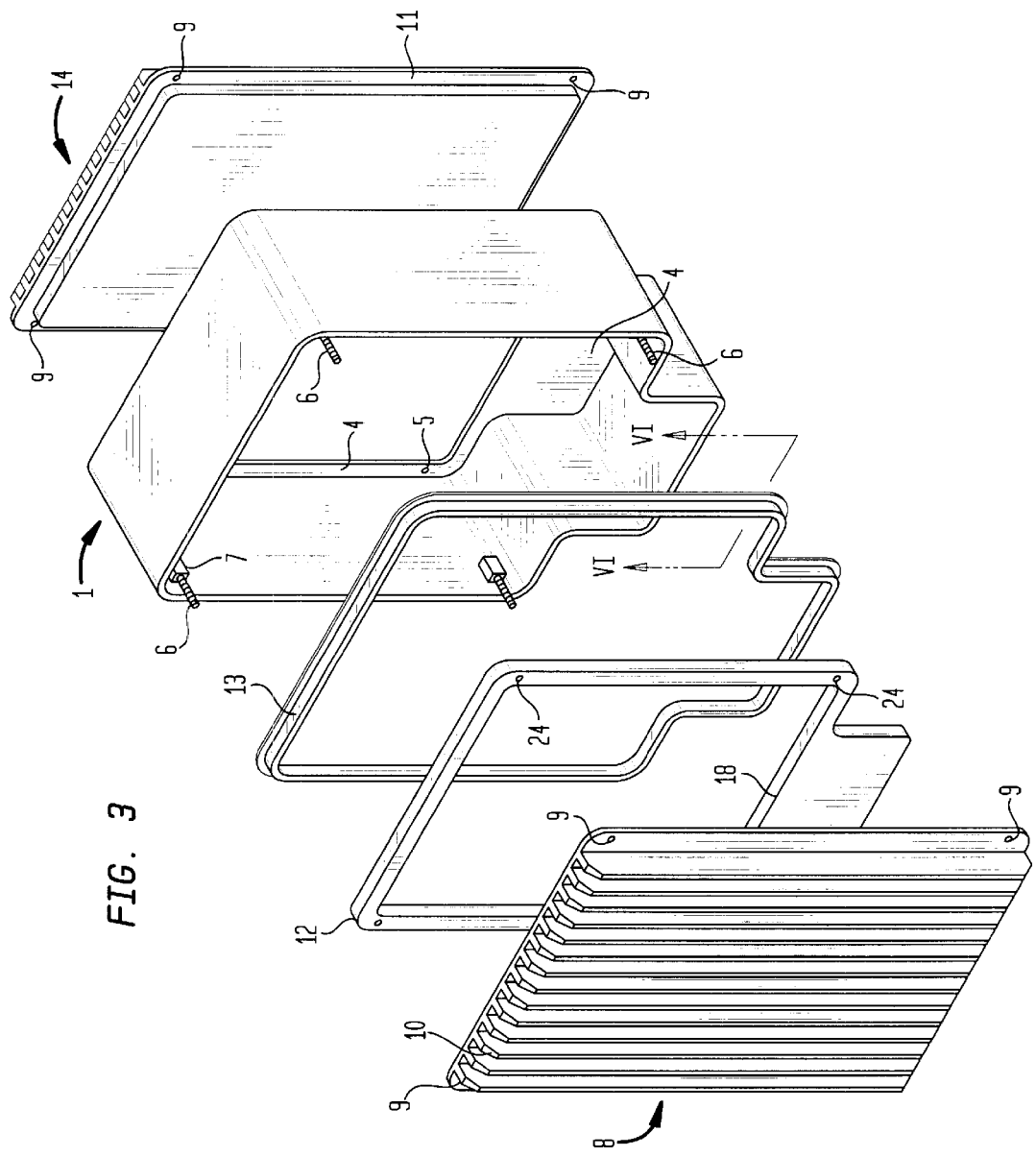
FIG. 3 is an exploded view of a weather resistant cabinet, in accordance with the present invention.

FIG. 3 illustrates the component parts of a weather resistant cabinet, in accordance with the present invention. The component parts include the first cover 8, a doorframe 12, a first gasket 13, the tubular housing 1, and a second cover 14. The second cover 14 is identical in structure to the first cover 8.

Figure 4:
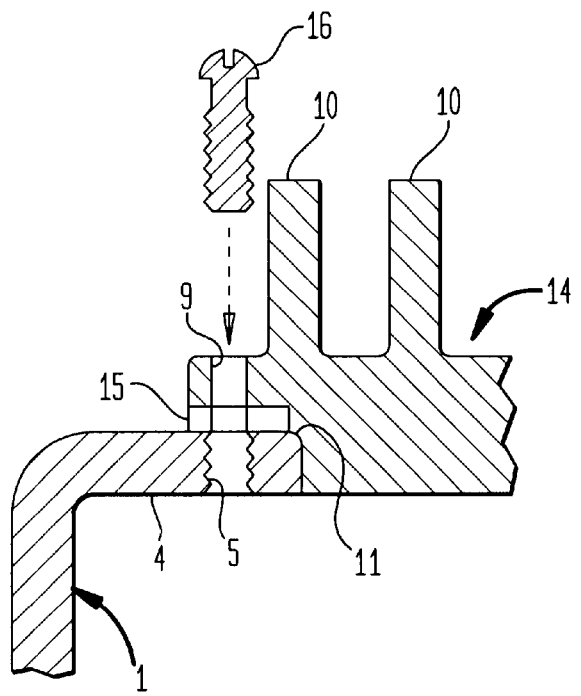
FIG. 4 is a close-up cross sectional view illustrating a connection between the cover and the tubular housing, in accordance with a first embodiment.

Reference will be made to FIG. 4 to illustrate the manner of attachment between the second cover 14 and the tubular housing 1. As illustrated, the recessed shelf 11 is sized to overlap the lip 4. A second gasket 15 is provided between the overlapped portions. The smooth through holes 9 of the second cover 14 will align with the threaded through holes 5 in the lip 4. Then, a threaded fastener 16, such as a screw, will be used to attach the second cover 14 to the tubular housing 1.

Figure 5:
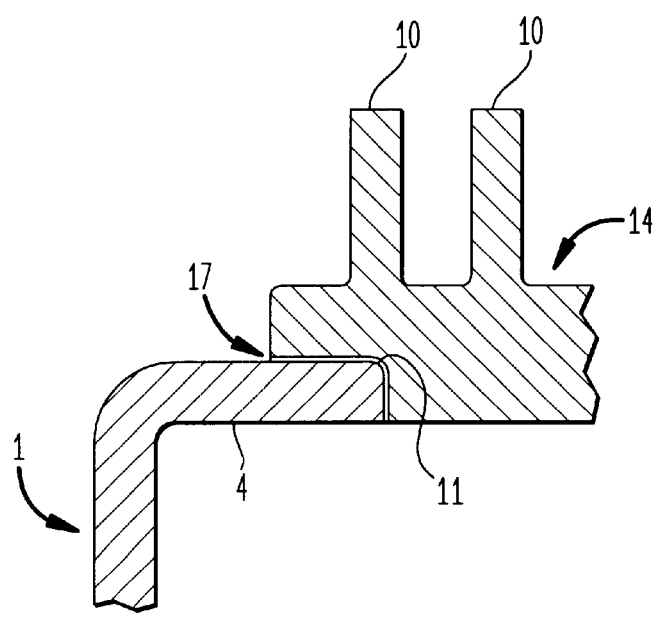
FIG. 5 is a close-up cross sectional view illustrating a connection between the cover and the tubular housing, in accordance with a second embodiment.

FIG. 5 illustrates an alternative manner of interconnecting the second cover 14 to the tubular housing 1. In FIG. 5, the recessed shelf 11 is again overlapped with the lip 4, however in this embodiment, there are no threaded through holes 5, smooth through holes 9, or threaded fasteners 16. In this embodiment, a dip-brazing technique, similar to soldering, is used. In dip-brazing, a special compound 17 is applied between the overlapped recessed shelf 11 and the lip 4. The assembly is heated and the compound adheres the recessed shelf 11 to the lip 4, while deforming to fill in any irregular contours therebetween.

Now, referring back to FIG. 3, the assembly of the front of the weather resistant cabinet will be described. The doorframe 12 is a generally flat planar sheet having a central opening 18 and four smooth through holes 24 formed in the corners thereof. The first cover 8 is attached to the doorframe 12 with its recessed shelf 11 overlapping the perimeter of the opening 18. The attachment between the first cover 8 and the doorframe 12 is preferably accomplished by the dip-brazing technique described above.

Figure 6:
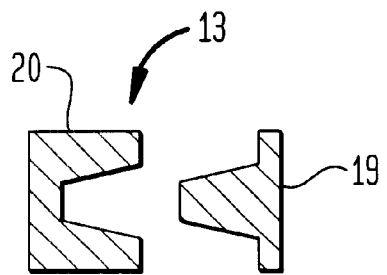
FIG. 6 is cross section view of a first gasket taken at line VI—VI of FIG. 3

The first gasket 13 is sandwiched between the outer perimeter of the tubular housing 1 and the doorframe 12. When the doorframe 12 is properly aligned with the tubular housing 1, the threaded studs 6 will pass through the smooth though holes 24 of the doorframe 12 and the smooth though holes 9 of the front cover 8. Lastly, threaded fasteners, such as nuts, are applied to the threaded studs 6 to secure the doorframe to the tubular housing 1 while compressing the first gasket 13. FIG. 6 is a cross section view illustrating the first gasket 13. Preferably, the first gasket 13 includes a first portion 19 and a second portion 20. The first portion 19 has a protruding V-shape, and the second portion 20 has a mating recessed V-shape. The first portion 19 would be affixed to the outer perimeter of the tubular housing 1 prior to assembly, and the second portion 20 would be affixed to the outer perimeter of the doorframe 12 prior to assembly. Of course, the first portion 19 could be affixed to the doorframe 12 and the second portion 20 could be affixed to the tubular housing 1.

FIG. 7 illustrates an alternative embodiment of the present invention. The alternative embodiment includes a modified tubular housing 21, modified doorframe 22, and modified gasket 23. Essentially, the outer contours of the modified component parts have been reshaped to approximate a rectangle, so as to better accommodate a particular size and spacing of the electrical equipment inside the cabinet. The interconnections between the component parts are accomplished in a manner as described above. FIG. 7 illiustrates the second cover 14 being attached to the tubular housing 1 by a dip-brazing technique, in accordance with FIG. 5. Of course, the second cover 14 could alternatively be attached to the tubular housing 14 using other manners, such as the threaded fasteners 16 of FIG. 4.

Figure 8:
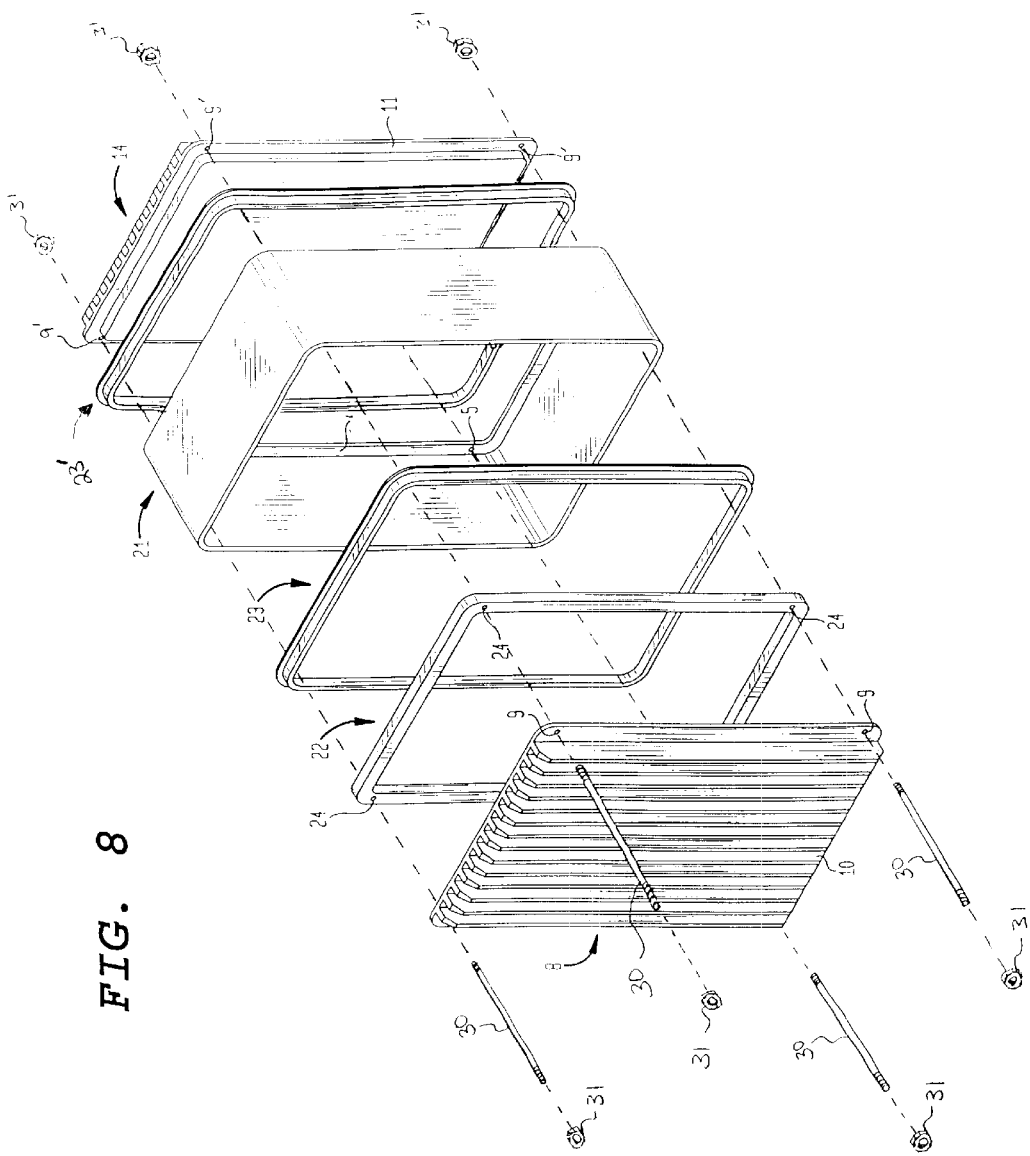
FIG. 8 is an exploded view, similar to FIG. 7, illustrating fasteners holding the housing together.

FIG. 8 illustrates another alternative embodiment of the present invention, similar to FIG. 7. In FIG. 8, a second modified gasket 23' is disposed between the second cover 14 and the tubular housing 21. A second plurality of holes 9' are formed in the second cover 14. A plurality of fasteners, in the form of threaded shafts 30 are provided. Each threaded shaft 30 passes through one of the first plurality of holes 9 in the first cover 8 and through one the second plurality of holes 9' in the second cover 14. Threaded fasteners, such as nuts 31, are applied to the threaded shafts 30 to interconnect the first cover 8, the tubular housing 21, and the second cover 14 while compressing the first and second gaskets 23, 23'. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed Is:

1. A cabinet for housing electrical equipment comprising:
   a tubular housing having a first open end and a second open end;
   a first cover closing said first open end;
   a second cover closing said second open end;
   a first gasket disposed between said tubular housing and said first cover; and
   at least one fastener interconnecting said first cover and said tubular housing while compressing said first gasket, wherein said first cover includes a frame having a third opening and a panel, in the form of a ribbed heatsink, attached to said frame by dip-brazing so as to close said third opening in said frame.

2. The cabinet according to claim 1, wherein said tubular housing is a deep-drawn, homogeneous piece of aluminum.

3. The cabinet according to claim 1, wherein said panel and said second cover are extruded pieces of aluminum.

4. The cabinet according to claim 1, further comprising:
   a first plurality of holes formed in said first cover, wherein said at least one fastener is a plurality of fasteners passing through said first plurality of holes in said first cover.

5. The cabinet according to claim 4, wherein said plurality of fasteners is a plurality of threaded studs fixed to said tubular housing and adapted to fit through said first plurality of holes in said first cover.

6. The cabinet according to claim 1, wherein said second cover is attached to said tubular housing by dip-brazing.

7. The cabinet according to claim 1, further comprising:
   a second gasket disposed between said second cover and said tubular housing; and
   a second plurality of holes formed in said second cover, wherein said plurality of fasteners are a plurality of threaded shafts, each threaded shaft passing through one of said first plurality of holes in said first cover and through one of said second plurality of holes in said second cover, to interconnect said first cover, said tubular housing, and said second cover while compressing said first and second gaskets.

8. The cabinet according to claim 1, wherein said second cover includes a plurality of rib shaped heat-sinks.

9. The cabinet according to claim 1, wherein said first gasket includes a first portion abutting one of said tubular housing and said first cover, and a second portion abutting the other of said tubular housing and said first cover, said first portion having a recess, and said second portion having a projection for engagement within said recess.

10. The cabinet according to claim 1, wherein said tubular housing has a perimeter in the shape of a rectangle.

11. The cabinet according to claim 1, wherein said second cover and said panel are constructed as substantially identical parts.

12. The cabinet according to claim 3, wherein said second cover and said panel are constructed as substantially identical parts.

\* \* \* \* \*